(12) United States Patent
Kumakura (10) Patent No.: US 7,901,768 B2
(45) Date of Patent: Mar. 8, 2011

(54) MULTILAYER ANISOTROPIC CONDUCTIVE ADHESIVE AND CONNECTION STRUCTURE USING THE SAME

(75) Inventor: Hiroyuki Kumakura, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 989 days.

(21) Appl. No.: 10/571,495

(22) PCT Filed: Sep. 9, 2004

(86) PCT No.: PCT/JP2004/013484
§ 371 (c)(1),
(2), (4) Date: Sep. 18, 2006

(87) PCT Pub. No.: WO2005/026279
PCT Pub. Date: Feb. 24, 2005

(65) Prior Publication Data
US 2007/0054114 A1 Mar. 8, 2007

(30) Foreign Application Priority Data

Sep. 12, 2003 (JP) ................................. 2003-322029

(51) Int. Cl.
*B32B 7/12* (2006.01)
*B32B 27/38* (2006.01)
*B32B 27/42* (2006.01)

(52) U.S. Cl. .... 428/343; 428/354; 428/349; 428/355 EP; 428/40.1; 428/41.8; 428/41.7

(58) Field of Classification Search .......................... None
See application file for complete search history.

(56) References Cited

U.S. PATENT DOCUMENTS

| 4,942,190 | A * | 7/1990 | Murayama et al. | 523/400 |
| 6,328,844 | B1 * | 12/2001 | Watanabe et al. | 156/330 |
| 2001/0018477 | A1 * | 8/2001 | Kumakura | 524/107 |
| 2003/0017327 | A1 * | 1/2003 | Paik et al. | 428/323 |
| 2003/0029559 | A1 * | 2/2003 | Yamada et al. | 156/307.7 |
| 2003/0102466 | A1 * | 6/2003 | Kumakura et al. | 252/511 |
| 2003/0164457 | A1 * | 9/2003 | Kumakura | 250/459.1 |

FOREIGN PATENT DOCUMENTS

| AU | 5530401 | 4/2001 |
| CN | 1319636 | 10/2001 |
| JP | 5 320610 | 12/1993 |
| JP | 2000 340613 | 12/2000 |
| JP | 2001 302881 | 10/2001 |
| JP | 2001 323246 | 11/2001 |
| KR | 2001 0088423 | 9/2001 |
| KR | 2002 0091216 | 12/2002 |
| TW | 487935 | 5/1991 |
| WO | WO 98/03047 | * 1/1998 |
| WO | WO 01 79374 | 10/2001 |

OTHER PUBLICATIONS

Kumakura Hiroyuki et al., "Anisotropic Conductive Adhesive and Anisotropic Conductive Adhesive Sheet Using the Same", abstract of JP 2005-097619A, Apr. 14, 2005.*
Kumakura Hiroyuki, Connected Structure, Machine translation of JP 2001-031929, Feb. 6, 2001.*
Hiroyuki, Kumakura et al. "Anisotropically Electroconductive Adhesive Film", English translation of JP 09-115335, May 2, 1997.*
Hiroyuki Kumakura et al., "Anisotropic Conductive Film", English translation of JP 09-025467, Jan. 28, 1997.*
Hiroyuki Kumakura et al. "Anisotropic Conductive Film", English translation of JP 08-124424, May 17, 1996.*
Yukio Yamada et al., "Anisotropic Conductive Film", English translation of JP 08-115617, May 7, 1996.*

* cited by examiner

*Primary Examiner* — Callie E Shosho
*Assistant Examiner* — Anish Desai
(74) *Attorney, Agent, or Firm* — Frommer Lawrence & Haug LLP; William S. Frommer; Thomas F. Presson (57) ABSTRACT

A multilayer anisotropic conductive adhesive a plurality of adhesive layers that are laminated, each of which contains an insulating resin and a hardening agent. The conductive particles are contained either in a first plurality of adhesive layers or in a second plurality of adhesive layers, and at least the top or bottom adhesive layer has the DSC (differential scanning calorimetry) exothermic peak temperature of 130° C. or more and 180° C. or less. Also, a connection structure is constructed in which a first electronic component having an electrode and an insulating film on the surface thereof and a second electronic component that has an electrode on the surface thereof are electrically connected through the multilayer anisotropic conductive adhesive.

4 Claims, 1 Drawing Sheet

MULTILAYER ANISOTROPIC CONDUCTIVE ADHESIVE AND CONNECTION STRUCTURE USING THE SAME

TECHNICAL FIELD

The present invention relates to a multilayer anisotropic conductive adhesive in which a plurality of adhesive layers are laminated, and to a connection structure in which electronic components are electrically connected through the multilayer anisotropic conductive adhesive.

BACKGROUND ART

On installing a bare chip on a substrate, a connective material such as a film-like adhesive, for example, an anisotropic conductive film (ACF) or non-conductive film (NCF), or a liquid adhesive, for example, an anisotropic conductive paste (ACP) or non-conductive paste (NCP) is used as means to electrically connect and fix an electrode on the substrate and an electrode on the chip.

Then, what is called a resin compression method, in which in the state of such connective material being held between the electrodes of the substrate and the chip, a resinous element is hardened by being pressed and heated, has been studied widely, because of its capability of reducing processes and improving productivity (see Patent Literature 1, for example).

[Patent Literature 1] Japanese Published Patent Application No. 2000-340613 (FIG. 2 and others)

DISCLOSURE OF INVENTION

When installing a bare chip on a substrate, connection reliability on a level approximately equal to the connection reliability of wire bonding or gold-gold junction is required.

Specifically, resistance to a PCT (Pressure Cooker Test; at 121° C. and 100% RH or at 110° C. and 85% RH), resistance to a TCT (Temperature Cycle Test; −55° C./125° C.), and resistance to reflow are typically required.

In particular, reflow resistance is strongly required to satisfy Level 2 or above (being passed through a reflow furnace after moisture absorption pretreatment for 168 h under the condition of 85° C. and 60% RH) defined according to JEDEC (Joint Electron Device Engineering Council) Standards.

However, regarding ACFs and NCFs in related art, there has been a problem with this reflow resistance.

Specifically, after reflow treatment, the chip may exfoliate from a connective material, and aging in the later PCT and the TCT makes the exfoliation develop to cause a defective conduction.

Further, in the case of installing a bare chip in particular, polyimide as an insulating film is typically formed on a silicon nitride film on the chip side as a wiring protection layer; however, there has been a problem of the film easily detaching from the adhered interface after reflow, as compared with the case of only a silicon nitride film provided.

Further, since a film-like adhesive in the past is high in minimum melt viscosity and therefore connection with high thrust (0.8N/bump or more) is needed to obtain connection reliability, there have been problems of chip breakage due to the high thrust, of requiring (particular) facilities for applying high thrust, and so forth.

In order to solve the above-described problems, in the present invention, a multilayer anisotropic conductive adhesive in which resistance to reflow is sufficiently obtained and which can facilitate connection, and a connection structure using the multilayer anisotropic conductive adhesive are provided.

A multilayer anisotropic conductive adhesive of the present invention includes a plurality of adhesive layers laminated, each of which at least contains an insulating resin and a hardening agent, in which conductive particles are contained in at least any one of the plurality of adhesive layers and at least the DSC (differential scanning calorimetry) exothermic peak temperature of the top adhesive layer or bottom adhesive layer is 130° C. or more and 180° C. or less.

Here, the DSC exothermic peak temperature is the peak temperature of an exothermic reaction obtained through the DSC (differential scanning calorimetry) method, which is a method of measuring, along with the temperature of the sample, the difference in calories incoming and outgoing regarding a sample and a reference material disposed in an electric furnace of an adjusted temperature.

According to the composition of the above-described multilayer anisotropic conductive adhesive of the present invention, since conductive particles are contained in at least any one of the plurality of adhesive layers, the upper side and lower side of the adhesive are conducted by the conductive particles after thermocompression. Further, since at least the DSC exothermic peak temperature of the top adhesive layer or bottom adhesive layer is 130° C. or more and 180° C. or less, such characteristic that the top adhesive layer or bottom adhesive layer does not easily exfoliate after reflow treatment is obtained, and exfoliation does not easily occur on the side in contact with the adhesive layer after reflow treatment.

It is assumed that the exothermic peak temperature is higher than an exothermic peak temperature of the past, which is lower than 130° C., and so hardening in the thermocompression may progress slowly in the reflow treatment to easily follow the expansion of electronic components connected.

Accordingly, if bonding is carried out with this adhesive layer, which does not easily exfoliate, facing the side of electronic components where exfoliation tends to occur after the reflow treatment, favorable reflow resistance can be obtained.

Regarding the above-described multilayer anisotropic conductive adhesive of the present invention, a structure including a first adhesive layer whose DSC exothermic peak temperature is 130° C. or more and 180° C. or less and a second adhesive layer whose DSC exothermic peak temperature is lower than that of the first adhesive layer by 10° C. or more is possible as well.

Accordingly, with the first adhesive layer facing the side of electronic components, where exfoliation tends to occur after reflow treatment, to obtain favorable reflow resistance, and with the second adhesive layer being disposed on the opposite side or in the middle and using, for example, typically-used relatively inexpensive material for the second adhesive layer, the cost as a whole can be reduced.

Regarding the above-described multilayer anisotropic conductive adhesive of the present invention, a structure in which the DSC exothermic peak temperature of the second adhesive layer is 110° C. or more and 140° C. or less is possible as well.

Regarding the above-described multilayer anisotropic conductive adhesive of the present invention, a structure in which both the first and second adhesive layers are 10 μm or more in thickness, and the ratio of the thickness of the first adhesive layer to that of the second adhesive layer is 0.2 or more and 7 or less is possible as well.

As described above, if both the first and second adhesive layers have a certain thickness or more and unless the thickness ratio is extremely large or extremely small, favorable characteristics can be obtained.

Regarding the above-described multilayer anisotropic conductive adhesive of the present invention, further a structure in which the first adhesive layer contains a thermosetting resin, a thermoplastic resin, a spherical inorganic filler and a hardening agent, and based on the total 100 pts.wt. of the thermosetting resin and the thermoplastic resin, contains the inorganic filler of 70 pts.wt. or more and 170 pts.wt. or less is possible as well.

A variety of known thermosetting resin, thermoplastic resin, spherical inorganic filler and hardening agents can be used as the above-described materials.

It is desirable that the inorganic filler be 70 pts.wt. or more and 170 pts.wt. or less based on the total 100 pts.wt. of the thermosetting resin and the thermoplastic resin. If the inorganic filler is too small in amount, the effectiveness of controlling exfoliation after the reflow treatment is lowered. If the inorganic filler is too large in amount, connection resistance becomes large.

Further, the amount of the thermosetting resin, the thermoplastic resin, the spherical inorganic filler and the hardening agent is selected to obtain such a characteristic that the DSC exothermic peak temperature of the first adhesive layer is 130° C. or more and 180° C. or less.

Furthermore, as the hardening agent of the first adhesive layer, a construction is desirable wherein any of 2-phenyl-4,5-dihydroxymethylimidazole, 2-phenyl-4-methyl-5-hydroxymethylimidazole and 2,4-diamino-6-[2'methylimidazolyl-(1')]-ethyl-s triazineisocyanuric acid adduct is contained by 5 pts.wt. to 15 pts.wt. based on the total 100 pts.wt. of the thermosetting resin and the thermoplastic resin.

With the above materials being used for the hardening agent, reflow resistance can further be improved.

Further, for example, the thermosetting resin contained in the first adhesive layer may be epoxy resin, and the thermoplastic resin contained therein may be phenoxy resin.

Furthermore, for example, as a hardening agent of the second adhesive layer, a composition containing a 2-phenylimidazole or latent imidazole hardening agent is desirable.

A connection structure of the present invention includes a first electronic component which has an electrode and an insulating film on the surface thereof and a second electronic component which has an electrode on the surface thereof, electrically connected through the above-described multilayer anisotropic conductive adhesive of the present invention.

According to the composition of the above-described connection structure of the present invention, since the first electronic component which has an electrode and an insulating film on the surface thereof and the second electronic component which has an electrode on the surface thereof are electrically connected through the above-described multilayer anisotropic conductive adhesive of the present invention, at least the DSC exothermic peak temperature of the top adhesive layer or bottom adhesive layer is 130° C. or more and 180° C. or less, and such a characteristic that the top adhesive layer or bottom adhesive layer does not easily exfoliate after reflow treatment is obtained; and therefore with this adhesive layer not easily exfoliating being disposed to face the side of electronic components where exfoliation tends to occur after reflow treatment, favorable reflow resistance can be obtained.

Regarding the above-described connection structure of the present invention, a structure in which the first electronic component which has an electrode and an insulating film on the surface thereof is a semiconductor chip, and the second electronic component which has an electrode on the surface thereof is a circuit substrate is possible as well.

Regarding the above-described connection structure of the present invention, a structure in which the insulating film is a silicon nitride film, and the first electronic component which has an electrode and the insulating film on the surface thereof and the adhesive layer, whose DSC exothermic peak temperature is 130° C. or more and 180° C. or less, of the multilayer anisotropic conductive adhesive are disposed to face each other is possible as well.

In the case where the insulating film on the surface of the first electronic component is a silicon nitride film, when the adhesive layer, whose DSC exothermic peak temperature is 130° C. or more and 180° C. or less, of the multilayer anisotropic conductive adhesive is disposed to face the first electronic component, more favorable reflow resistance can be obtained.

Regarding the above-described connection structure of the present invention, a structure in which the insulating film is a polyimide film, and the second electronic component which has an electrode on the surface thereof and the adhesive layer, whose DSC exothermic peak temperature is 130° C. or more and 180° C. or less, of the multilayer anisotropic conductive adhesive are disposed to face each other is possible as well.

In the case where the insulating film on the surface of the first electronic component is a polyimide film, when the adhesive layer, whose DSC exothermic peak temperature is 130° C. or more and 180° C. or less, of the multilayer anisotropic conductive adhesive is disposed to face the second electronic component, more favorable reflow resistance can be obtained.

According to the above-described present invention, since the multilayer anisotropic conductive adhesive has an adhesive layer whose DSC exothermic peak temperature is 130° C. or more and 180° C. or less, a connective material (adhesive) and a connection structure with excellent resistance reflow can be obtained, which has been difficult to be obtained in a conventional connective material.

BEST MODE OF CARRYING OUT THE INVENTION

Figure 1:
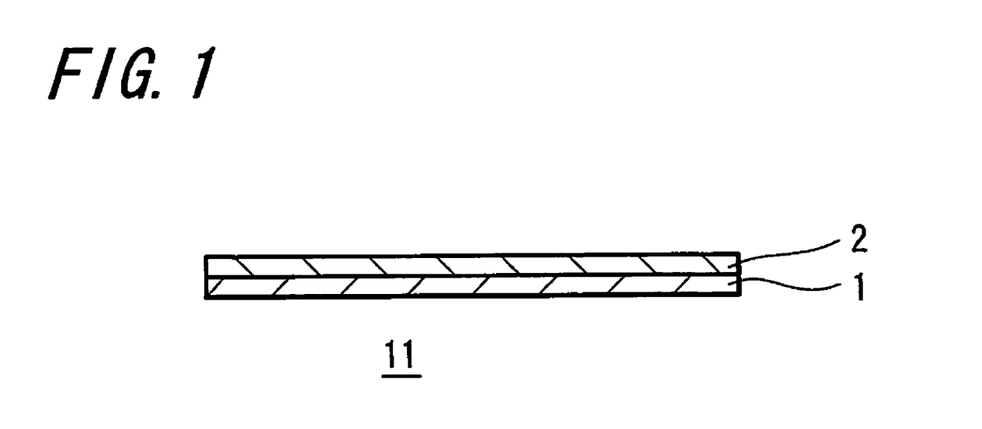
FIG. 1 is a schematic sectional view of an embodiment of a multilayer anisotropic conductive adhesive of the present invention.

FIG. 1 shows a schematic structural view (sectional view) of an embodiment of a multilayer anisotropic conductive adhesive of the present invention.

A multilayer anisotropic conductive adhesive 11 includes a first adhesive layer 1 and a second adhesive layer 2 laminated thereon.

At least either the first adhesive layer 1 or the second adhesive layer 2 contains conductive particles. Thus, after the multilayer anisotropic conductive adhesive 11 is heated and compressed, the upper side and lower side of the adhesive are conducted (electrically connected).

Further, before it is used, this multilayer anisotropic conductive adhesive 11 is preserved with a release film, not shown in the figure, attached to one of or both of main surfaces (the upper surface and the lower surface) thereof.

When manufacturing the multilayer anisotropic conductive adhesive 11 of the above structure, coating liquid in which materials for the adhesive layer have been dissolved in a solvent is made, for example, and then the coating liquid is applied to a release film, not shown in the figure, to form an adhesive layer and so a film-like adhesive for each adhesive layer is formed. After that, the two layers of film-like adhesive are stuck together such that the opposite side to the release film of one layer faces the opposite side to the release film of another layer.

In addition, if coating liquid can be applied to another coating liquid depending on characteristics such as the viscosity of coating liquid and the volatility of a solvent, two layers of the coating liquid can be applied sequentially to the same release film to manufacture the multilayer anisotropic conductive adhesive 11.

In this embodiment, the first adhesive layer 1 which is the lower layer, in particular, has a DSC exothermic peak temperature of 130° C. to 180° C., and the DSC exothermic peak temperature of the second adhesive layer 2 which is the upper layer is lower than that of the first adhesive layer 1 by 10° C. or more (for example, less than 130° C.).

Thus, particularly the first adhesive layer 1 has operational effectiveness of not easily exfoliating after reflow treatment.

Therefore, adhesive in which reflow resistance is improved than before and which has favorable reflow resistance can be constructed.

Then, when manufacturing a connection structure in which two electronic components are connected to the multilayer anisotropic conductive adhesive 11 on the upper and lower sides thereof, it is considered that reflow resistance can be improved more efficiently, if the first adhesive layer 1 is disposed on the side where exfoliation tends to occur after reflow treatment.

Figure 2:
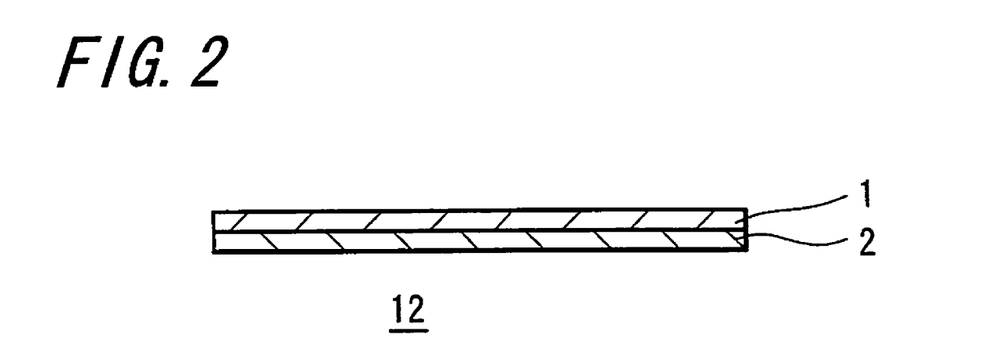
FIG. 2 is a schematic sectional view of another embodiment of a multilayer anisotropic conductive adhesive of the present invention.

Further, a schematic structural view (sectional view) of an embodiment of a multilayer anisotropic conductive adhesive of the present invention is shown in FIG. 2.

A multilayer anisotropic conductive adhesive 12 has a structure in which a first adhesive layer 1 and a second adhesive layer 2 switch positions with each other as compared with the multilayer anisotropic conductive adhesive 11 in FIG. 1.

In this case also, the first adhesive layer 1, which is the upper layer, has a DSC exothermic peak temperature of 130° C. to 180° C.; and the DSC exothermic peak temperature of the second adhesive layer 2, which is the lower layer, is lower than that of the first adhesive layer 1 by 10° C. or more (for example, less than 130° C.).

Thus, similarly to the multilayer anisotropic conductive adhesive 11 in FIG. 1, particularly the first adhesive layer 1 has operational effectiveness with which exfoliation tends to be prevented from occurring after reflow treatment, and so adhesive having favorable reflow resistance can be obtained.

Then, either the multilayer anisotropic conductive adhesive 11 in FIG. 1 or the multilayer anisotropic conductive adhesive 12 in FIG. 2, which is preferable depending on the structure of electronic components (a circuit substrate, a chip and other components) stuck to a multilayer anisotropic conductive adhesive on the upper side and lower side thereof, is selected.

For example, in the above-described installation of a bare chip in a substrate, thermocompression is typically carried out with the substrate disposed below and the chip disposed above, and so a multilayer anisotropic conductive adhesive may be selected according to the structure of electrodes and an insulating film on the surfaces of the substrate and the chip.

For example, in the case where the insulating film on the surface of the chip is a silicon nitride film, if the first adhesive layer 1 is on the chip side, reflow resistance becomes favorable, and therefore the multilayer anisotropic conductive adhesive 12 in FIG. 2, in which the upper layer on the chip side is the first adhesive layer 1, may be selected.

Further, for example, in the case where the insulating film on the surface of the chip is a polyimide film (including the case where a polyimide film is formed on the surface of a silicon nitride film as well), if the first adhesive layer 1 is on the substrate side, reflow resistance becomes favorable, and therefore the multilayer anisotropic conductive adhesive 11 in FIG. 1, in which the lower layer on the substrate side is the first adhesive layer 1, may be selected.

It should be noted that in the embodiments of FIGS. 1 and 2 there is a difference to some extent between DSC exothermic peak temperature of the first adhesive layer 1 and the temperature of the second adhesive layer 2, however, the present invention includes a structure in which both the two adhesive layers have a DSC exothermic peak temperature in the range of 130 C to 180° C., and a structure in which there is small difference in exothermic peak temperature of the two adhesive layers.

Further, in the present invention, a multilayer anisotropic conductive adhesive may be constructed by laminating three adhesive layers or more.

In that case, at least the top adhesive layer or bottom adhesive layer, namely the adhesive layer on at least one adhesive surface is composed of an adhesive layer whose DSC exothermic peak temperature is in the range of 130° C. to 180° C.

Figure 3:
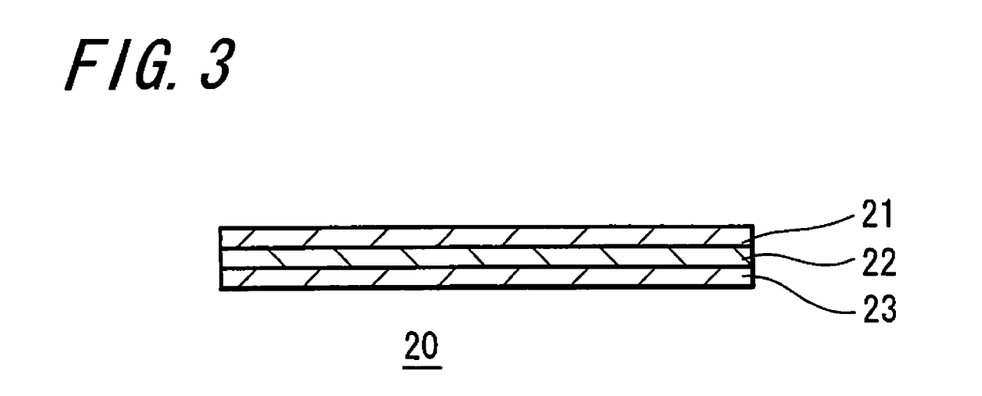
FIG. 3 is a schematic sectional view of yet another embodiment of a multilayer anisotropic conductive adhesive of the present invention.

As yet another embodiment of a multilayer anisotropic conductive adhesive of the present invention, a sectional view in the case of three adhesive layers being laminated is shown in FIG. 3.

This multilayer anisotropic conductive adhesive 20 is composed by laminating three adhesive layers 21, 22 and 23.

Among the three adhesive layers 21, 22 and 23, at least one adhesive layer contains conductive particles.

Further, at least the top adhesive layer 21 or bottom adhesive layer 23 is an adhesive layer whose DSC exothermic peak temperature is in the range of 130° C. to 180° C. Note that all three layers 21, 22 and 23 may be adhesive layers whose DSC exothermic peak temperatures are in the range of 130° C. to 180° C.

With the above structure, exfoliation after reflow treatment on the adhesive surface of the top adhesive layer 21 or bottom adhesive layer 23 can be controlled, and thus reflow resistance can be improved.

PRACTICE EXAMPLES

Hereinafter, practice examples of the present invention will be explained in detail, together with comparative examples.

Phenoxy resin and epoxy resin were used as insulating resins, imidazole-based hardening agent was used as a hardening agent, spherical silica was used as a filler, gold-plated resinous particles were used as conductive particles; and then each of these materials was used by weight parts shown in Table 1 and was evenly mixed in a combined solvent of toluene and ethyl acetate to make coating liquid of six kinds of film-like adhesives for films 1 to 6.

Here, details of the materials shown in Table 1 are as follows:
YP50 (BPA-type phenoxy resin, manufactured by Tohto Kasei Co., Ltd.)

HP4032D (naphthalene-type epoxy resin, manufactured by Dainippon Ink And Chemicals, Incorporated)

EP807 (BPF-type epoxy resin, manufactured by Japan Epoxy Resin Co., Ltd.)

2PHZ (2-phenyl-4,5-dihydroxymethylimidazole; imidazole-based hardening agent, manufactured by Shikoku Chemicals Corporation)

2P4MHZ (2-phenyl-4-methyl-5-hydroxymethylimidazole; imidazole-based hardening agent, manufactured by Shikoku Chemicals Corporation)

2MAOK (2,4-diamino-6-[2'methylimidazolyl-(1')]-ethyl-s triazineisocyanuric acid adduct; imidazole-based hardening agent, manufactured by Shikoku Chemicals Corporation)

2PZ (2-phenylimidazole; imidazole-based hardening agent, manufactured by Shikoku Chemicals Corporation)

HX3941HP (master batch type latent hardening agent, epoxy/imidazole hardening agent=2/1, manufactured by Asahi Kasei Epoxy Co., Ltd.)

spherical silica (0.5 μm in average particle diameter φ, manufactured by Tatsumori Ltd.)

gold-plated resinous particles (5 μm in average particle diameter φ)

Further, coating liquid for each of the films 1 to 6 was applied to a release film, and after solvent was removed, an adhesive layer of each film was sampled and the exothermic peak temperatures of DSC (differential scanning calorimetry) was measured. The measurement results of the DSC exothermic peak temperature are also shown in Table 1.

TABLE 1

|  | Film 1 | Film 2 | Film 3 | Film 4 | Film 5 | Film 6 |
| --- | --- | --- | --- | --- | --- | --- |
| YP50 | 40 | 40 | 40 | 40 | 20 | 40 |
| HP4032D |  |  |  |  | 50 |  |
| EP807 | 50 | 50 | 50 | 40 |  | 50 |
| 2PHZ | 10 |  |  |  |  |  |
| 2P4MHZ |  | 10 |  | 5 |  |  |
| 2MAOK |  |  | 10 |  |  |  |
| HX3941HP |  |  |  | 15 | 30 |  |
| 2PZ |  |  |  |  |  | 10 |
| Spherical Silica (φ0.5 μm) | 100 | 100 | 100 | 100 | 100 | 100 |
| Gold-plated resinous particles (φ5 μm) | 20 | 20 | 20 | 20 | 20 | 20 |
| DSC peak temperature (° C.) | 171 | 151 | 145 | 130 | 121 | 126 |

As shown in Table 1, each of the films 1 to 4 had DSC exothermic peak temperature in the range of 130° C. to 180° C., and the films 5 and 6 had DSC exothermic peak temperatures less than 130° C.

Practice Example 1

As a first adhesive layer the film 2 of 40 μm in thickness whose DSC exothermic peak temperature is 151° C. was given and as a second adhesive layer the film 5 of 10 μm in thickness whose DSC exothermic peak temperature is 121° C. was given; and a multilayer anisotropic conductive adhesive of two-layer structure was formed by laminating these layers.

Specifically, after coating liquid of the adhesive layer was applied to a release film to make each of the films (the film 2 and the film 5) for adhesive layers, the two films were stuck on their surfaces opposite to the release films to obtain multilayer anisotropic conductive adhesive approximately 50 μm in thickness.

The following structure was prepared as a substrate and a chip.

The substrate used: FR-5 glass epoxy substrate (glass epoxy layer 0.6 mm/Cu pattern 35 μm/surface Ni/Au plating; at a pitch of 150 μm)

The chip used: 6.3 mm☐ in size, 0.4 mm in thickness, and an Au stud bump (50 μm in top diameter φ and 30 μm in thickness) and a wiring protection layer made of a silicon nitride film whose thickness is 5 μm were formed.

Then, the first adhesive layer (film 2) was disposed on the chip side and the second adhesive layer (film 5) was disposed on the substrate side, and the whole structure was pressed and bonded on the conditions at 200° C. for 20 secs and 0.6N/bump in thrust to connect the chip and the substrate, and so a connection structure of Practice Example 1 was thus obtained.

Practice Examples 2 to 5

Connection structures of Practice Examples 2 to 5 were obtained similarly to Practice Example 1, except that the thickness of first adhesive layer (film 2) and second adhesive layer (film 5) were altered as shown in Table 2, respectively.

Practice Example 6

As a first adhesive layer the film 1 of 15 μm in thickness whose DSC exothermic peak temperature is 171° C. was given and as a second adhesive layer the film 5 of 35 μm in thickness was given; and a multilayer anisotropic conductive adhesive of two-layer structure was formed by laminating these layers, and a connection structure of Practice Example 6 was obtained other than that similarly to Practice Example 1.

Practice Example 7

As a first adhesive layer the film 4 of 15 μm in thickness whose DSC exothermic peak temperature is 130° C. was given and as a second adhesive layer the film 5 of 35 μm in thickness was given; and a multilayer anisotropic conductive adhesive of two-layer structure was formed by laminating these layers, and a connection structure of Practice Example 7 was obtained other than that similarly to Practice Example 1.

Practice Example 8

As a first adhesive layer the film 3 of 15 μm in thickness whose DSC exothermic peak temperature is 145° C. was given and as a second adhesive layer the film 5 of 35 μm in thickness was given; and a multilayer anisotropic conductive adhesive of two-layer structure was formed by laminating these layers, and a connection structure of Practice Example 8 was obtained other than that similarly to Practice Example 1.

Comparative Example 1

The film 6 of 15 μm in thickness whose DSC exothermic peak temperature is 118° C. was given and the film 5 of 35 μm in thickness whose DSC exothermic peak temperature is 121° C. was given; and a multilayer anisotropic conductive adhesive of two-layer structure was formed by laminating these layers, and by disposing the multilayer anisotropic conductive adhesive of two-layer structure such that the film 6 was on the chip side and the film 5 was on the substrate side, a connection structure of Comparative Example 1 was obtained other than that similarly to Practice Example 1.

Practice Examples 9 and 10

Connection structures of Practice Examples 9 and 10 were obtained similarly to Practice Example 1, except that the thickness of first adhesive layer (film 2) and that of the second adhesive layer (film 5) had been altered as shown in Table 2.

Comparative Example 2

A film-like adhesive was formed by applying the film 5 of 50 μm in thickness whose DSC exothermic peak temperature is 121° C. to a release film, and using this adhesive a connection structure of Comparative Example 2 was obtained by pressing and bonding a substrate and a chip on a similar condition to Practice Example 1.

Comparative Example 3

A film-like adhesive was formed by applying the film 2 of 50 μm in thickness whose DSC exothermic peak temperature is 151° C. to a release film, and using this adhesive a connection structure of Comparative Example 3 was obtained by pressing and bonding a substrate and a chip on a similar condition to Practice Example 1.

Evaluation Tests

The following evaluation tests were carried out on those connection structures of Practice Examples 1 to 10 and Comparative Examples 1 to 3.

An external appearance test after reflow: samples of the connection structures were passed through a reflow furnace (at the maximum temperature 250° C.) three times, after being subjected to moisture absorption pretreatment for 24 h under the condition of 85° C. and 85% RH, then whether or not exfoliation occurred between a chip and a connective material was observed with a SAT (supersonic flaw detector). The sign x was given to samples in which exfoliation was seen in half the connected areas or more, the sign Δ was given to samples in which exfoliation was partly seen, the sign ○ was given to samples in which almost no exfoliation was seen, and the sign ⊚ was given to samples in which there was no exfoliation.

A connection reliability test: samples of the connection structures were passed through a reflow furnace three times, after being subjected to moisture absorption pretreatment for 24 h under the condition of 85° C. and 85% RH, then aging was carried out on the samples for 200 h in a PCT (at 110° C. and 85% RH) and the conduction resistance was measured. Further, the samples of the connection structures were passed through a reflow furnace three times, after being subjected to moisture absorption pretreatment for 24 h under the condition of 85° C. and 85% RH, then 500 cycles of aging were carried out on the samples in a TCT (at −55° C./125° C. 15 min. each) and the conduction resistance was measured. Regarding both the tests, the sign x was given to samples in which an open was generated, the sign Δ was given to samples in which no open was generated but an increase in resistance was seen, and the sign ○ was given to samples in which there was almost no increase in resistance.

The composition of the adhesives of Practice Examples and Comparative Examples, and the results of the evaluation tests are shown in Table 2. Further, regarding samples in which an adhesive was made of two layers of film, the difference in DSC exothermic peak temperatures (the film on the chip side—the film on the substrate side) and the ratio of film thickness (the film on the chip side/the film on the substrate side), are also shown in Table 2.

TABLE 2

| DSC peak temperature (° C.) | Practice Example 1 | Practice Example 2 | Practice Example 3 | Practice Example 4 | Practice Example 5 | Practice Example 6 | Practice Example 7 |
|---|---|---|---|---|---|---|---|
| Film 1 171 | | | | | | chip side 15 μm | |
| Film 2 151 | chip side 40 μm | chip side 35 μm | chip side 25 μm | chip side 15 μm | chip side 10 μm | | |
| Film 3 145 | | | | | | | |
| Film 4 130 | | | | | | | chip side 15 μm |
| Film 5 121 | sub. side 10 μm | sub. side 15 μm | sub. side 25 μm | sub. side 35 μm | sub. side 40 μm | sub. side 35 μm | sub. side 35 μm |
| Film 6 118 | | | | | | | |
| Diff. in DSC peak temp. bet. 1st and 2nd layers (° C.) | 30 | 30 | 30 | 30 | 30 | 50 | 11 |
| Diff. bet. film thickness (chip side/sub. side) | 4 | 2.3 | 1 | 0.43 | 0.25 | 0.43 | 0.43 |
| Appearance after reflow | ⊚ | ⊚ | ⊚ | ⊚ | ⊚ | ⊚ | ○ |
| Connection reliability | | | | | | | |
| PCT | ○ | ○ | ○ | ○ | ○ | ○ | ○ |
| TCT | ○ | ○ | ○ | ○ | ○ | ○ | ○ |

TABLE 2-continued

| DSC peak temperature (° C.) | Practice Example 8 | Comparative Example 1 | Practice Example 9 | Practice Example 10 | Comparative Example 2 | Comparative Example 3 |
|---|---|---|---|---|---|---|
| Film 1 171 | | | | | | |
| Film 2 151 | | | chip side 45 μm | chip side 5 μm | | 50 μm |
| Film 3 145 | chip side 15 μm | | | | | |
| Film 4 130 | | | | | | |
| Film 5 121 | sub. side 35 μm | sub. side 35 μm | sub. side 5 μm | sub. side 45 μm | 50 μm | |
| Film 6 118 | | chip side 15 μm | | | | |
| Diff. in DSC peak temp. bet. 1st and 2nd layers (° C.) | 24 | 5 | 30 | 30 | — | — |
| Diff. bet. film thickness (chip side/sub. side) | 0.43 | 0.43 | 9 | 0.11 | — | — |
| Appearance after reflow | ⊚ | X | ○ | Δ | X | ○ |
| Connection reliability | | | | | | |
| PCT | ○ | X | Δ | ○ | ○ | X |
| TCT | ○ | X | Δ | ○ | ○ | X |

According to Table 2, it is understood that in the case where the difference in DSC exothermic peak temperature between two layers of film is 10° C. or more (Practice Examples 1 to 10), both external appearance and connection reliability after moisture absorption pretreatment and reflow was executed are favorable.

In the case where the DSC exothermic peak temperature of an adhesive layer on the chip side is 130° C. or more and 180° C. or less and hydroxymethylated imidazole is used as a hardening agent thereof, a particularly favorable result can be obtained.

Regarding the thickness of two layers of film, in the case where both layers of film are 10 μm or more and the ratio of one layer of film to the other is in the range of 0.2 to 6, a particularly favorable result can be obtained.

According to Table 2, it is understood that in Comparative Example 1 in which the difference in DSC exothermic peak temperature between two layers of film is less than 10° C. and both the two layers of film have peak temperatures less than 130° C., exfoliation largely occurs after the moisture absorption pretreatment and reflow executed, and the reliability is low.

According to Table 2, in the case of a single layer as in Comparative Examples 2 and 3, such a favorable characteristic as in the cases of two layers of film being laminated cannot be obtained.

In Comparative Example 2 in which only the film 5 whose DSC exothermic peak temperature is 121° C. was used, exfoliation largely occurred after the moisture absorption pretreatment and reflow executed.

On the other hand, in Comparative Example 3 in which only the film 2 whose DSC exothermic peak temperature is 151° C. was used, an open was generated, causing defective conduction.

As regards a conventional single-layer film-like connective material, the DSC exothermic peak temperature is less than 130° C., and so a similar result to Comparative Example 1 or 2 will be obtained.

In addition, although not shown in Table 2, if a hardening agent whose DSC exothermic peak temperature is over 180° C. is used as a material for an adhesive layer, the hardening agent will not harden under practical hardening conditions and so is not suitable for practical use.

Therefore, it is understood that when a first adhesive layer whose DSC exothermic peak temperature is in the range of 130° C. to 180° C. is used to make an adhesive of two-layer structure in which this first adhesive layer and another adhesive layer are laminated and to be disposed such that the first adhesive layer is on the chip side to be pressed and bonded, the external appearance and connection reliability after reflow become favorable, in other words, reflow resistance becomes favorable.

The above-described Practice Examples 1 to 10 were the cases where a first adhesive layer whose DSC exothermic peak temperature is in the range of 130° C. to 180° C. was disposed on the chip side; and further, regarding the case where a first adhesive layer whose DSC exothermic peak temperature is in the range of 130° C. to 180° C. was disposed on the substrate side, reflow resistance was also studied.

Practice Example 11

As a first adhesive layer the film 2 of 40 μm in thickness whose DSC exothermic peak temperature is 151° C. was given and as a second adhesive layer the film 5 of 10 μm in thickness whose DSC exothermic peak temperature is 121° C. was given; and a multilayer anisotropic conductive adhesive of two-layer structure was formed by laminating these layers.

Specifically, after coating liquid of the adhesive layer was applied to a release film to make each of the films (the film 2 and the film 5) for adhesive layers, the two films were stuck on their surfaces opposite to the release films to obtain multilayer anisotropic conductive adhesive approximately 50 μm in thickness.

The following structure was prepared as a substrate and a chip.

The substrate used: FR-5 glass epoxy substrate (glass epoxy layer 0.6 mm/Cu pattern 35 μm/surface Ni/Au plating; at a pitch of 150 μm)

The chip used: 6.3 mm□ in size, 0.4 mm in thickness, and an Au stud bump (50 μm in top diameter φ and 30 μm in thickness) and a wiring protection layer made of a photosensitive polyimide insulating film whose thickness is 5 μm were formed.

Then, the release films were removed and the first adhesive layer (film 2) was disposed on the chip side and the second adhesive layer (film 5) was disposed on the substrate side, and the whole structure was pressed and bonded on the conditions at 200° C. for 20 secs and 0.6N/bump in thrust to connect the chip and the substrate, and so a connection structure of Practice Example 11 was thus obtained.

Practice Examples 12 to 15

Connection structures of Practice Examples 12 to 15 were obtained similarly to Practice Example 11, except that the thickness of first adhesive layer (film 2) and second adhesive layer (film 5) were altered as shown in Table 3, respectively.

Practice Example 16

As a first adhesive layer the film 1 of 35 μm in thickness whose DSC exothermic peak temperature is 171° C. was given and as a second adhesive layer the film 5 of 15 μm in thickness was given; and a multilayer anisotropic conductive adhesive of two-layer structure was formed by laminating these layers, and a connection structure of Practice Example 16 was obtained other than that similarly to Practice Example 11.

Practice Example 17

As a first adhesive layer the film 4 of 35 μm in thickness whose DSC exothermic peak temperature is 130° C. was given and as a second adhesive layer the film 5 of 15 μm in thickness was given; and a multilayer anisotropic conductive adhesive of two-layer structure was formed by laminating these layers, and a connection structure of Practice Example 17 was obtained other than that similarly to Practice Example 11.

Practice Example 18

As a first adhesive layer the film 3 of 35 μm in thickness whose DSC exothermic peak temperature was 145° C. was given and as a second adhesive layer the film 5 of 15 μm in thickness was given; and a multilayer anisotropic conductive adhesive of two-layer structure was formed by laminating these layers, and a connection structure of Practice Example 18 was obtained other than that similarly to Practice Example 11.

Comparative Example 4

The film 6 of 35 μm in thickness whose DSC exothermic peak temperature is 118° C. was given and the film 5 of 15 μm in thickness whose DSC exothermic peak temperature is 121° C. was given; and a multilayer anisotropic conductive adhesive of two-layer structure was formed by laminating these layers, and by disposing the multilayer anisotropic conductive adhesive of two-layer structure such that the film 6 was on the substrate side and the film 5 was on the chip side, a connection structure of Comparative Example 4 was obtained other than that similarly to Practice Example 11.

Practice Examples 19 and 20

Connection structures of Practice Examples 19 and 20 were obtained similarly to Practice Example 11, except that the thickness of first adhesive layer (film 2) and that of the second adhesive layer (film 5) had been altered as shown in Table 3.

Comparative Example 5

A film-like adhesive was formed by applying the film 5 of 50 μm in thickness whose DSC exothermic peak temperature is 121° C. to a release film, and using this adhesive a connection structure of Comparative Example 5 was obtained by pressing and bonding a substrate and a chip on a similar condition to Practice Example 11.

Comparative Example 6

A film-like adhesive was formed by applying the film 2 of 50 μm in thickness whose DSC exothermic peak temperature is 151° C. to a release film, and using this adhesive a connection structure of Comparative Example 6 was obtained by pressing and bonding a substrate and a chip on a similar condition to Practice Example 11.

Evaluation Tests

The following evaluation tests were carried out on those connection structures of Practice Examples 11 to 20 and Comparative Examples 4 to 6.

An external appearance test after reflow: samples of the connection structures were passed through a reflow furnace (at the maximum temperature 250° C.) three times, after being subjected to moisture absorption pretreatment for 24 h under the condition of 85° C. and 85% RH, then whether or not exfoliation occurred between a chip and a connective material was observed with a SAT (supersonic flaw detector). The sign x was given to samples in which exfoliation was seen in half the connected areas or more, the sign Δ was given to samples in which exfoliation was partly seen, the sign ○ was given to samples in which almost no exfoliation was seen, and the sign ◎ was given to samples in which there were no exfoliation.

A connection reliability test: samples of the connection structures were passed through a reflow furnace three times, after being subjected to moisture absorption pretreatment for 24 h under the condition of 85° C. and 85% RH, then aging was carried out on the samples for 200 h in a PCT (at 110° C. and 85% RH) and the conduction resistance was measured. Further, the samples of the connection structures were passed through a reflow furnace three times, after being subjected to moisture absorption pretreatment for 24 h under the condition of 85° C. and 85% RH, then 500 cycles of aging were carried out on the samples in a TCT (at −55° C./125° C. 15 min. each) and the conduction resistance was measured. Regarding both the tests, the sign x was given to samples in which an open was generated, the sign Δ was given to samples in which no open was generated but an increase in resistance was seen, and the sign ○ was given to samples in which there was almost no increase in resistance.

The composition of the adhesives of Practice Examples and Comparative Examples, and the results of the evaluation tests are shown in Table 2. Further, regarding samples in which an adhesive was made of two layers of film, the difference in DSC exothermic peak temperatures (the film on the chip side−the film on the substrate side) and the ratio of film thickness (the film on the chip side/the film on the substrate side), are also shown in Table 3.

TABLE 3

| DSC peak temperature (° C.) | Practice Example 11 | Practice Example 12 | Practice Example 13 | Practice Example 14 | Practice Example 15 | Practice Example 16 | Practice Example 17 |
|---|---|---|---|---|---|---|---|
| Film 1 171 | | | | | | | sub. side 35 μm |
| Film 2 151 | sub. side 40 μm | sub. side 35 μm | sub. side 25 μm | sub. side 15 μm | sub. side 10 μm | | |
| Film 3 145 | | | | | | | |
| Film 4 130 | | | | | | | sub. side 35 μm |
| Film 5 121 | chip side 10 μm | chip side 15 μm | chip side 25 μm | chip side 35 μm | chip side 40 μm | chip side 15 μm | chip side 15 μm |
| Film 6 118 | | | | | | | |
| Diff. in DSC peak temp. bet. 1st and 2nd layers (° C.) | 30 | 30 | 30 | 30 | 30 | 50 | 11 |
| Diff. bet. film thickness (chip side/sub. side) | 0.25 | 0.43 | 1 | 2.3 | 4 | 0.43 | 0.43 |
| Appearance after reflow | ⊚ | ⊚ | ⊚ | ○ | ○ | ⊚ | ○ |
| Connection reliability | | | | | | | |
| PCT | ○ | ○ | ○ | ○ | ○ | ○ | ○ |
| TCT | ○ | ○ | ○ | ○ | ○ | ○ | ○ |

| DSC peak temperature (° C.) | Practice Example 18 | Comparative Example 4 | Practice Example 19 | Practice Example 20 | Comparative Example 5 | Comparative Example 6 |
|---|---|---|---|---|---|---|
| Film 1 171 | | | | | | |
| Film 2 151 | | | sub. side 45 μm | sub. side 5 μm | | 50 μm |
| Film 3 145 | sub. side 35 μm | | | | | |
| Film 4 130 | | | | | | |
| Film 5 121 | chip side 15 μm | chip side 15 μm | chip side 5 μm | chip side 45 μm | 50 μm | |
| Film 6 118 | | sub. side 15 μm | | | | |
| Diff. in DSC peak temp. bet. 1st and 2nd layers (° C.) | 24 | 5 | 30 | 30 | — | — |
| Diff. bet. film thickness (chip side/sub. side) | 0.43 | 0.43 | 0.11 | 9 | — | — |
| Appearance after reflow | ⊚ | X | Δ | ○ | ○ | X |
| Connection reliability | | | | | | |
| PCT | ○ | X | ○ | Δ | X | Δ |
| TCT | ○ | X | ○ | Δ | X | Δ |

According to Table 3, it is understood that in the case where the difference in DSC exothermic peak temperature between two layers of film is 10° C. or more (Practice Examples 11 to 20), both external appearance and connection reliability after moisture absorption pretreatment and reflow executed are favorable.

In the case where the DSC exothermic peak temperature of an adhesive layer on the substrate side is 130° C. or more and 180° C. or less and hydroxymethylated imidazole is used as a hardening agent thereof, a particularly favorable result can be obtained.

Regarding the thickness of two layers of film, it is preferable in the case where both layers of film are 10 μm or more and the ratio of one layer of film to the other is in the range of 0.1 to 9, more preferable being in the range being 0.2 to 4, and a particularly favorable result can be obtained when the range is 0.2 to 1.

According to Table 3, it is understood that in Comparative Example 4 in which the difference in DSC exothermic peak temperature between two layers of film is less than 10° C. and both the two layers of film have peak temperatures less than 130° C., exfoliation largely occurs after the moisture absorption pretreatment and reflow executed, and the reliability is low.

According to Table 3, in the case of a single layer as in Comparative Examples 5 and 6, such a favorable characteristic as in the cases of two layers of film being laminated cannot be obtained.

In Comparative Example 5 in which only the film 5 whose DSC exothermic peak temperature is 121° C. was used, exfoliation largely occurred after the moisture absorption pretreatment and reflow were executed.

On the other hand, in Comparative Example 6 in which only the film 2 whose DSC exothermic peak temperature is 151° C. was used, an open was generated, causing defective conduction.

In addition, although not shown in Table 3, if a hardening agent whose DSC exothermic peak temperature is over 180°

C. is used as a material for an adhesive layer, the hardening agent will not harden under practical hardening conditions and so is not suitable for practical use.

Therefore, it is understood that when a first adhesive layer whose DSC exothermic peak temperature is in the range of 130° C. to 180° C. is used to construct an adhesive of two-layer structure in which the first adhesive layer and another adhesive layer are laminated and to be disposed such that the first adhesive layer is on the substrate side to be pressed and bonded, the external appearance and connection reliability after reflow become favorable, in other words, reflow resistance becomes favorable.

Furthermore, in the above-described Practice Examples, the films of two adhesive layers constituting a multilayer anisotropic conductive adhesive each contain gold-plated resinous particles; however, in the present invention, as described above, desired conductivity can be obtained, provided that at least one adhesive layer contains conductive particles.

Further, whether or not conductive particles are contained in an adhesive layer on the side bonded to a substrate and a chip does not much affect reflow resistance.

The present invention is not limited to the above-described embodiments but can be applied to various other structures without departing from the gist of the present invention.

The invention claimed is:

1. A multilayer anisotropic conductive adhesive, comprising:
   a plurality of adhesive layers laminated and including a first adhesive layer and a second adhesive layer,
   wherein conductive particles are contained in at least any one of the plurality of adhesive layers, and the DSC exothermic peak temperature of the first adhesive layer is 130° C. or more and 180° C. or less and the DSC exothermic peak temperature of the second adhesive layer is 110° C. or more and 140° C. or less, and the DSC exothermic peak temperature of the second adhesive layer is lower than that of the first adhesive layer by 10° C. or more, and
   wherein each of the first adhesive layer and the second adhesive layer contains epoxy resin as a thermosetting resin, phenoxy resin as a thermoplastic resin, and a hardening agent, and
   wherein the first adhesive layer contains spherical inorganic fillers of 70 pts.wt, or more and 170 pts.wt or less, based on a total 100 pts.wt of the thermosetting resin and the thermoplastic resin.

2. A multilayer anisotropic conductive adhesive according to claim 1,
   wherein both said first and second adhesive layers are 10 μm or more in thickness, and the ratio of the thickness of said first adhesive layer to that of said second adhesive layer is 0.2 or more and 7 or less.

3. A multilayer anisotropic conductive adhesive according to claim 1,
   wherein said first adhesive layer contains as a hardening agent any of 2-phenyl-4,5-dihydroxymethylimidazole, 2-phenyl-4-methyl-5-hydroxymethylimidazole and 2,4-diamino-6-[2'-methylimidazolyl(1')]-ethyl-s triazine isocyanuric acid adduct of 5 pts.wt. or more and 15 pts.wt. or less, based on the total 100 pts.wt. of the thermosetting resin and the thermoplastic resin.

4. A multilayer anisotropic conductive adhesive according to claim 1,
   wherein said second adhesive layer contains a 2-phenylimidazole or latent imidazole hardening agent as a hardening agent.

* * * * *